(12) United States Patent
Dolfi et al.

(10) Patent No.: US 8,325,461 B2
(45) Date of Patent: Dec. 4, 2012

(54) PRINTED WIRING BOARD FEED-THROUGH CAPACITOR

(75) Inventors: Eugene W. Dolfi, Rockford, IL (US);
Mark W. Metzler, Davis, IL (US);
Mark C. Lukan, Rockford, IL (US);
Eric A. Carter, Monroe, WI (US)

(73) Assignee: Hamilton Sundstrand Corporation, Rockford, IL (US)

( * ) Notice: Subject to any disclaimer, the term of this patent is extended or adjusted under 35 U.S.C. 154(b) by 805 days.

(21) Appl. No.: 12/188,457

(22) Filed: Aug. 8, 2008

(65) Prior Publication Data

US 2010/0033893 A1 Feb. 11, 2010

(51) Int. Cl.
*H01G 4/35* (2006.01)
*H01G 4/30* (2006.01)
*H01G 4/228* (2006.01)
*H01G 4/236* (2006.01)
*H01G 4/08* (2006.01)

(52) U.S. Cl. .................. 361/302; 361/301.4; 361/306.3; 361/307; 361/323

(58) Field of Classification Search ............... 361/301.4, 361/323, 307, 306.3, 302, 306.1
See application file for complete search history.

(56) References Cited

U.S. PATENT DOCUMENTS

| | | | |
|---|---|---|---|
| 4,148,003 A | 4/1979 | Colburn et al. | |
| 4,935,842 A | 6/1990 | Carlson et al. | |
| 5,031,069 A | 7/1991 | Anderson | |
| 5,040,091 A | 8/1991 | Yamaoka et al. | |
| 5,800,575 A | 9/1998 | Lucas | |
| 6,256,850 B1 | 7/2001 | Lauffer et al. | |
| 6,333,857 B1 | 12/2001 | Kanbe et al. | |
| 6,421,225 B2 | 7/2002 | Bergstedt | |
| 6,756,628 B2 * | 6/2004 | Echigo et al. | 257/306 |
| 6,831,529 B1 | 12/2004 | Devoe et al. | |
| 6,891,258 B1 | 5/2005 | Alexander et al. | |
| 7,035,077 B2 * | 4/2006 | Brendel | 361/302 |
| 7,184,256 B1 | 2/2007 | Sato et al. | |
| 7,916,448 B2 * | 3/2011 | Zhao et al. | 361/307 |
| 2002/0137391 A1 | 9/2002 | Berberich | |
| 2004/0233016 A1 | 11/2004 | Devoe et al. | |
| 2006/0203456 A1 * | 9/2006 | Sohn et al. | 361/748 |

FOREIGN PATENT DOCUMENTS

GB 2315921 2/1998

OTHER PUBLICATIONS

European Search Report, mailed May 18, 2010 in counterpart European Application No. 09251959.4-2214.

* cited by examiner

*Primary Examiner* — Eric Thomas
*Assistant Examiner* — Arun Ramaswamy
(74) *Attorney, Agent, or Firm* — Kinney & Lange, P.A.

(57) ABSTRACT

A feed-through capacitor is constructed in a printed wiring board using alternating layers of metal capacitive layers and plastic dielectric layers of the printed wiring board. The large number of layers, the avoidance of ceramic layers and the flexible geometry of this device allow it to be used in many applications, particularly in those involving high power high current. Also, because it utilizes a printed wiring board, the capacitor can be made in numerous sizes and shapes.

7 Claims, 6 Drawing Sheets

PRINTED WIRING BOARD FEED-THROUGH CAPACITOR

STATEMENT OF GOVERNMENT INTEREST

This invention was made with Government support under contract no. N0019-02-C-3002 awarded by the Department of the Navy. The Government has certain rights in this invention.

BACKGROUND OF THE INVENTION

A feed-through capacitor connects to a conductive shaft or stud that passes through a chassis wall, and it filters unwanted high-frequency electromagnetic interference from an electrical circuit. A feed-through capacitor may be used on either an input or output conductor, and it prevents electromagnetic interference from getting into or out of the circuit. Feed-through capacitors are generally positioned close to a connection interface in order to isolate the connection from electromagnetic interference.

Feed-through capacitors are connected from a conductor to the chassis of a device and they provide a path for high frequency current to flow from the conductor to the chassis. In a typical feed-through capacitor, a capacitive element surrounds the stud and is coupled to both the stud and the inside of the chassis wall. The capacitive element provides a low impedance path from the stud to the chassis wall. However, the capacitive element appears as an insulator to low frequency current, and therefore it does not divert the low frequencies from the stud to the chassis. High frequencies, in contrast, are shunted from the stud to the chassis. In essence, a feed-through capacitor is a short circuit that only short-circuits frequencies that are undesirable for a particular application. Feed-through capacitors generally operate in the kilohertz to megahertz range.

Feed-through capacitors are typically made for small contacts and small currents, and are commonly used in low power, radio frequency applications. In high power applications, and particularly high current applications, there is no generally accepted method for applying feed-through capacitors to a circuit. High power applications require capacitors with large capacitance. Most feed-through capacitors utilize ceramic discs as their dielectric layer and, since capacitance is proportional to the size of the capacitor's dielectric layer, high power applications require capacitors with large ceramic discs. Because ceramics are brittle by nature, it is difficult to make ceramic discs large enough for use in capacitors for high power circuits.

Therefore, there is a need in the art for a feed-through capacitor that is able to work effectively in high power, and particularly high current, circuits. It is also desirable that the feed-through capacitor be simple and inexpensive to manufacture, yet sturdy enough for industrial applications.

SUMMARY OF THE INVENTION

The invention is a feed-through capacitor that utilizes a printed wiring board as the capacitive element. The feed-through capacitor is built in the printed wiring board as a multi-layer stack, allowing it to be easily integrated into circuits that are constructed on the printed wiring board. The invention exhibits a high capacitance and avoids the need for brittle and expensive ceramic dielectric layers. As a result, the invention may be used in high power and high current applications for which traditional feed-through capacitors are not suitable.

DETAILED DESCRIPTION

Figure 1:
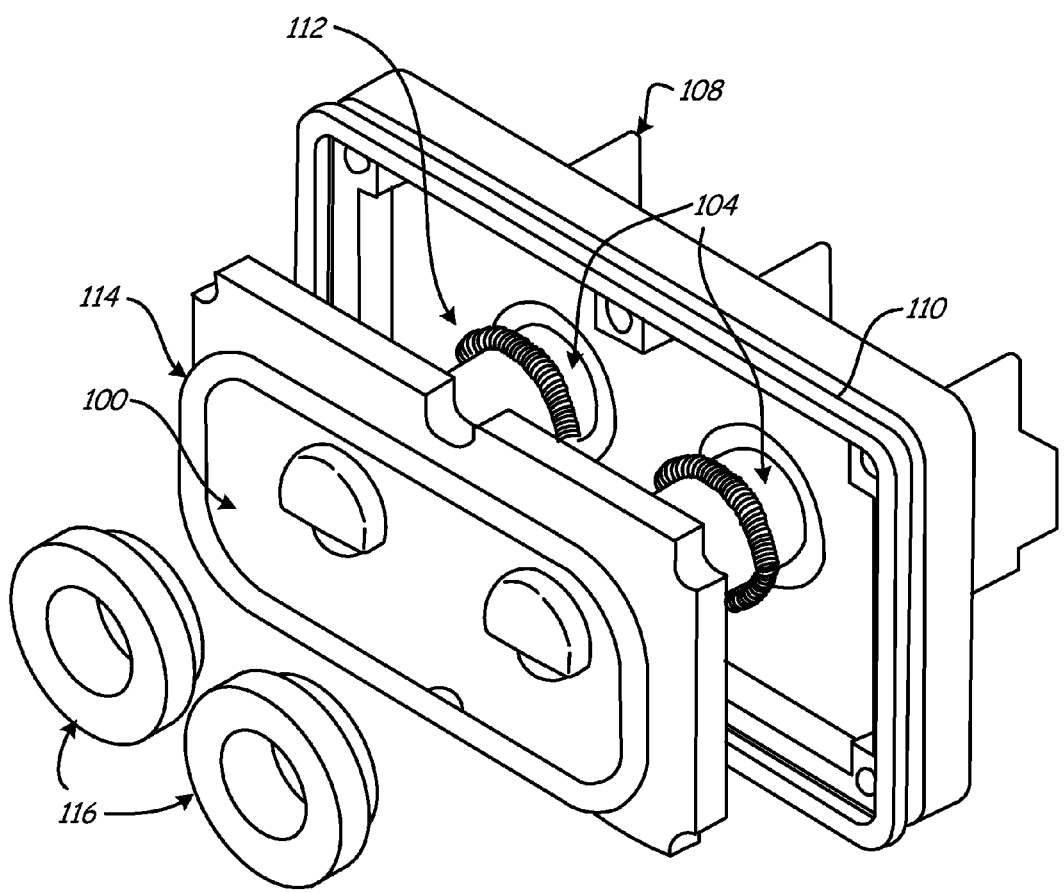
FIG. 1 shows a perspective view of one embodiment of the invention.

FIG. 1 shows an embodiment of the invention. Capacitor 100 is constructed in a printed wiring board. Terminal studs 104 pass through openings in capacitor 100. Capacitor 100 attaches to terminal block 108. Gasket seal 110 and stud contact spring 112 facilitate connection between terminal block 108 and capacitor 100. Chassis contact spring 114 and stud boot seals 116 are located on the underside of capacitor 100 and facilitate connection with the chassis (not shown).

Figure 2:
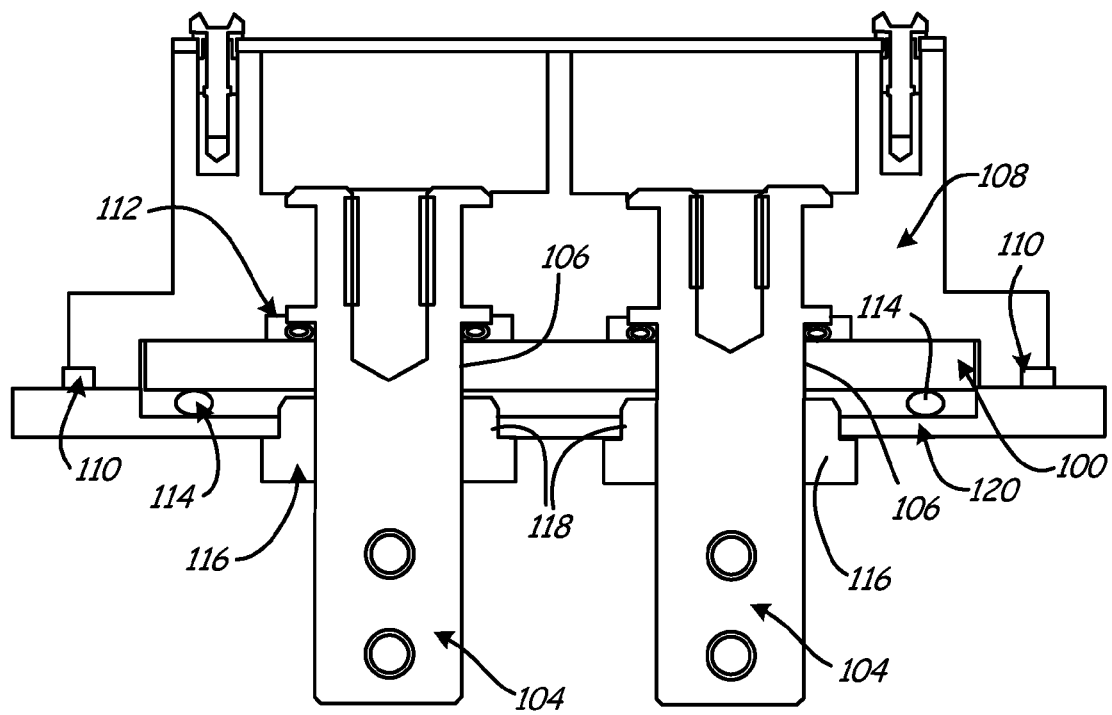
FIG. 2 shows a cross-sectional view of the embodiment of the invention shown in FIG. 1.

FIG. 2 is a cross-sectional view of the assembled components shown in FIG. 1. In FIG. 2, capacitor 100 is fit into position against terminal block 108. Terminal stud 104 passes through openings 106 in capacitor 100 and openings 118 in chassis wall 120. Stud boot seals 116 seal the opening of the studs 104 through wall 120. Capacitor 100 is held in place by sandwiching between wall 120 and terminal block 108 floated on contact springs 112 and 114. Terminal block 108 is held to wall 120 by fasteners (not shown). Chassis contact spring 114 is interposed between capacitor 100 and chassis wall 120, and gasket seal 110 is interposed between terminal block 108 and chassis 120.

Figure 3:
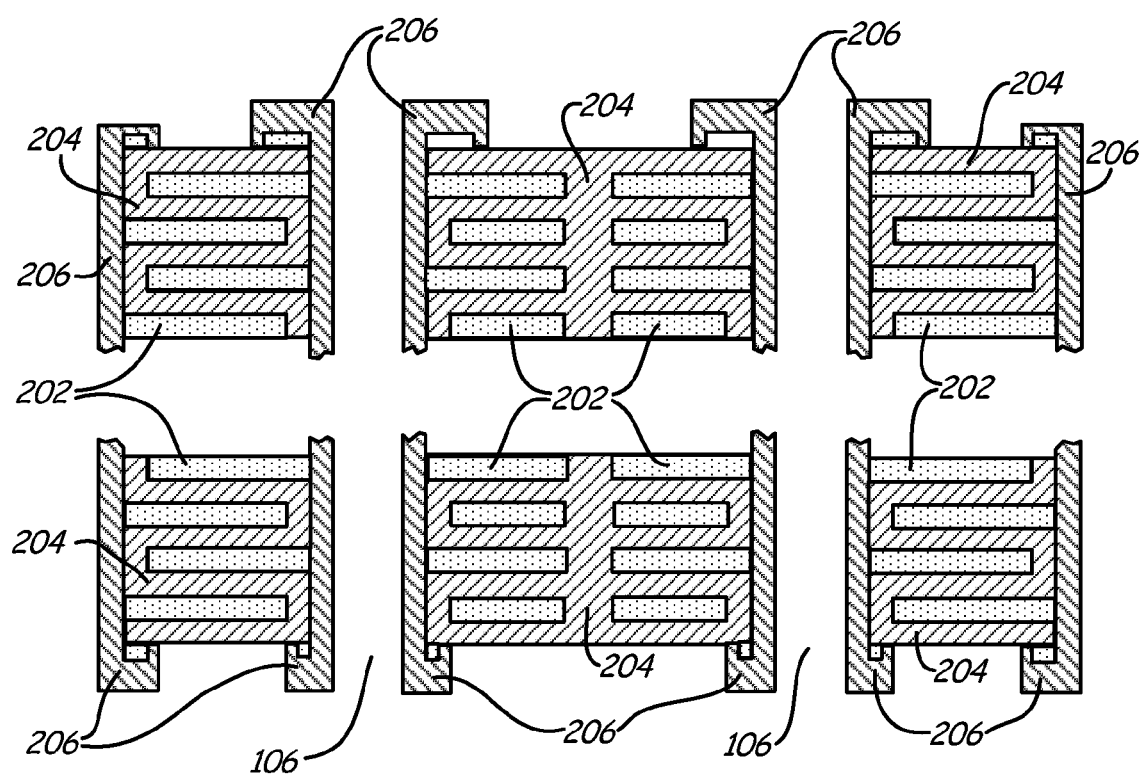
FIG. 3 shows a detailed cross-sectional view of the multiple capacitive layers of the invention

FIG. 3 is a cross-sectional view of capacitor 100 formed in a printed wiring board. Capacitor 100 is formed of alternating layers of metal and dielectric material. Metal layers 202 may be made of any suitable metal, such as copper. Dielectric layer 204 is made from a polymer, such as polyimide or FR-4. Side plating 206 surrounds capacitor 100 along its outsides, along the walls of openings 106, and along part of the top portion. Side plating 206 is electrically connected to the chassis or to the terminal stud(s). In the example shown in FIG. 3, side plating 206 on the outside of the capacitor is electrically connected to the chassis, while side plating 206 lining openings 106 in the capacitor is electrically connected to the terminal studs. Metal layers 202 connect to side plating 206 as shown; metal layers 202 that do not show a connection to side plating 206 in FIG. 3 are connected to side plating 206 that is electrically connected to the chassis at a plane above or below the paper, since side plating 206 connected to the chassis is actually in the form of a ring that extends out of the plane of the paper. In one embodiment, there are a total of approximately 30 metal layers and 30 dielectric layers inside of capacitor 100.

Because feed-through capacitor 100 does not use a ceramic material for its dielectric layer, it is sturdier and lighter than traditional ceramic feed-through capacitors. Also, using a polymer as a dielectric material in feed-through capacitor 100 allows feed-through capacitor 100 to be constructed in any printed wiring board. Feed-through capacitor 100 may be made in any size, limited only by the size of printed wiring boards that can be fabricated. In addition, ceramic capacitors are limited in shape to discs, toroids or blocks, because only simple shapes are practicable for manufacture with ceramics. A printed wiring board capacitor allows the use of almost any shape, because the printed wiring board can be cut into different shapes. Furthermore, ceramic capacitors must, by their nature be relatively thin. In contrast, printed wiring board capacitor 100 is made of multiple layers of metals and polymers, and thus may be made in any thickness. Also, the use of multiple layers of metals and polymers in printed wiring board feed-through capacitor 100 allows for the use of a smaller footprint for the capacitor. Instead of making the footprint larger to increase capacitance, as would be necessary with traditional ceramic capacitors, additional layers may be added to printed wiring board feed-through capacitor 100 to increase capacitance. In some embodiments, multiple printed wiring board substrates and metal layers may be stacked to form the desired feed-through capacitor configuration.

One skilled in the art will recognize that the alternating metal and dielectric layers of feed-through capacitor 100 can be made from any suitable materials. By way of example, in one embodiment of feed-through capacitor 100, 0.5 ounce (~14 gram) copper material of 0.0007 inches (~0.018 millimeters) in thickness is used for the metal layers 202 and a polymer of 0.0050 inches (~0.13 millimeters) in thickness is used for dielectric layer 204. One embodiment of the capacitor produces a value between 0.0112 to 0.0115 microfarads using polyimide as the dielectric material and 0.0133 to 0.0163 microfarads using FR-4 as the dielectric material.

Figure 4:
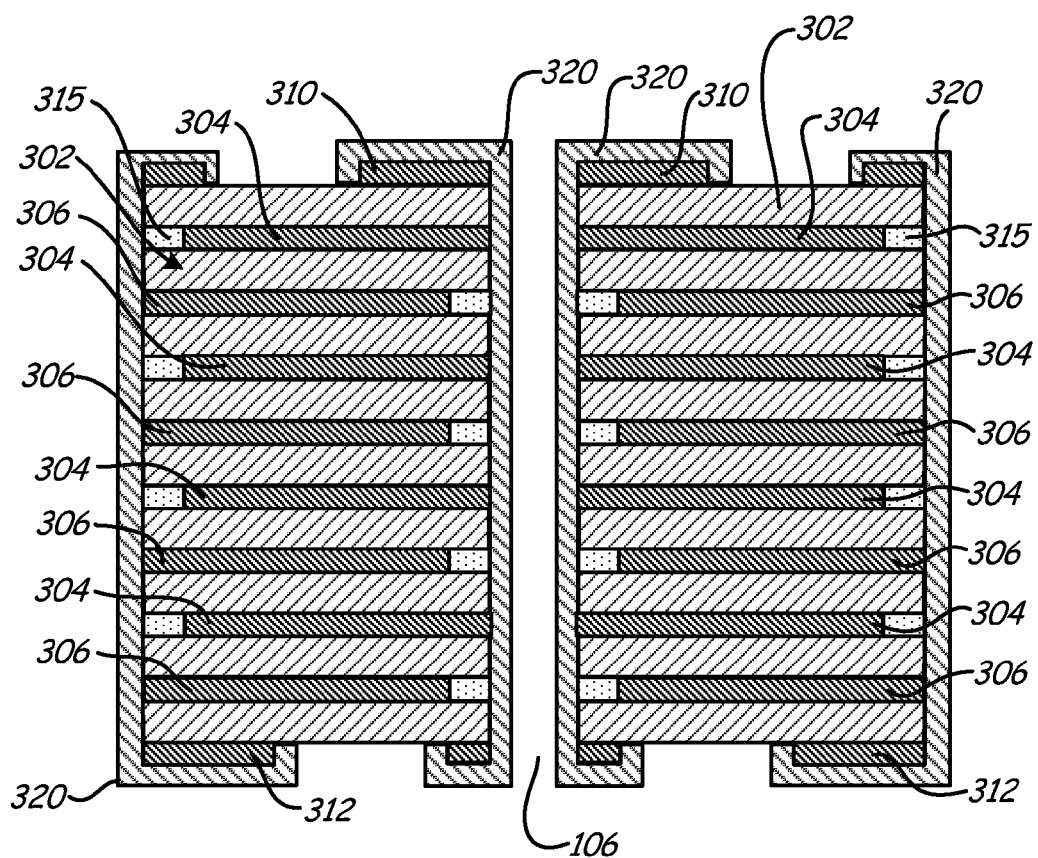
FIG. 4 shows a more detailed cross-sectional view of the multiple capacitive layers of the invention.

FIG. 4 shows a more detailed view of the cross-section shown in FIG. 3. Dielectric layer 302 is positioned between alternating positive plates 304 and negative plates 306. Positive plates 304 are connected to stud conducting ring 310 and negative plates 306 are connected to chassis conducting ring 312. Adhesive fill 315 is located in each metallic layer for positive plates 304 and negative plates 306. As discussed with respect to previous figures, positive plates 304 and negative plates 306 may be made from any suitable metal, such as copper, and dielectric layer 302 is made from a polymer, such as polyimide or FR-4. Plating 320 surrounds the metal and dielectric layers. Plating 320 is made of a metal, such as nickel.

By utilizing printed wiring boards as the manufacturing elements for feed-through capacitors, the size of the feed-through capacitor is limited only by the size of the presses which are used to make the printed wiring boards. Traditional feed-through capacitors use a ceramic material for the dielectric layer. Capacitance is proportional to the size of the dielectric layer, and it is difficult to manufacture ceramic discs of a sufficient size for use in high current applications, because ceramic materials are brittle and large ceramic discs will break.

In contrast, the present invention uses a feed-through capacitor built in a printed wiring board. Ceramics are not used, so there is no danger that the ceramic dielectric will break. Therefore, printed wiring board feed-through capacitors are ideally suited for high-current applications. Also, because the invention is manufactured using circuit board fabrication techniques, the invention may be made in many sizes, shapes and thicknesses. It is also less expensive to manufacture than traditional ceramic disc feed-through capacitors.

Furthermore, a printed wiring board feed-through capacitor may be connected to any part of a circuit, in the same manner that other components are connected together in printed wiring board circuit. For example, additional discrete capacitance, or devices for voltage sensing, current sensing or current monitoring could be built onto the printed wiring board in addition to the feed-through capacitor. Thus, for example, a feed-through capacitor could be built onto a certain portion of the printed wiring board, and the feed-through capacitor could be used for other applications that would normally require the addition of multiple capacitors to the printed wiring board. The use of printed wiring board capacitors allows more complex shapes and simplicity of connecting circuit elements in a circuit. In many applications, this more-flexible geometry and ease of connection greatly outweighs the added weight of the printed wiring board feed-through capacitor.

Figure 5:
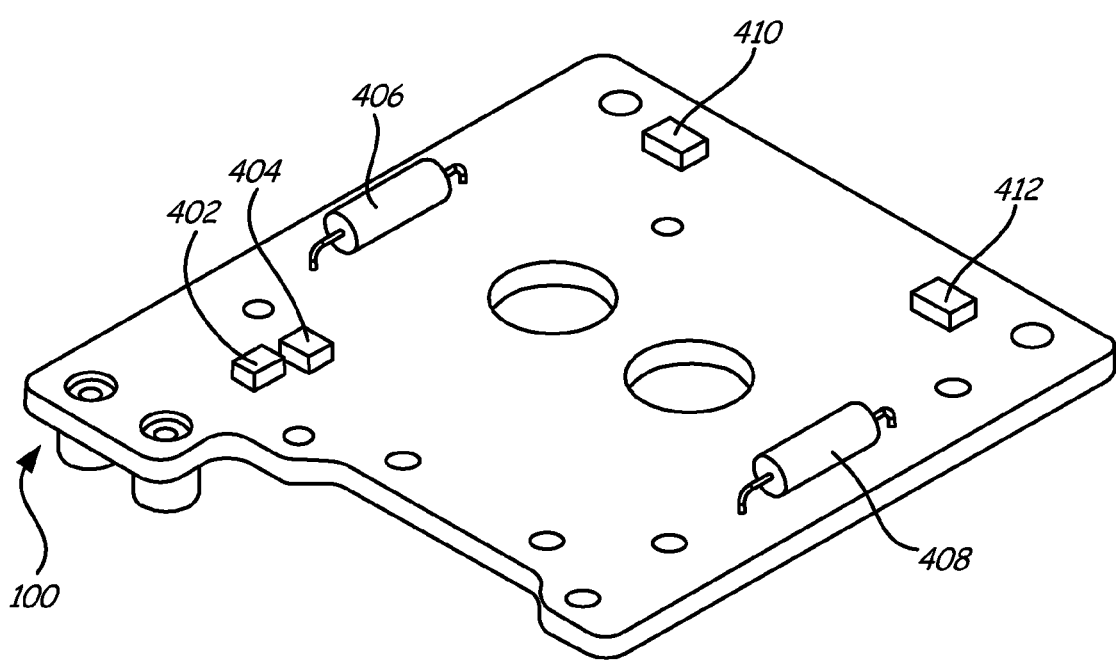
FIG. 5 shows a perspective view of a printed wiring board having both a feed-through capacitor and other circuit components.
Figure 6:
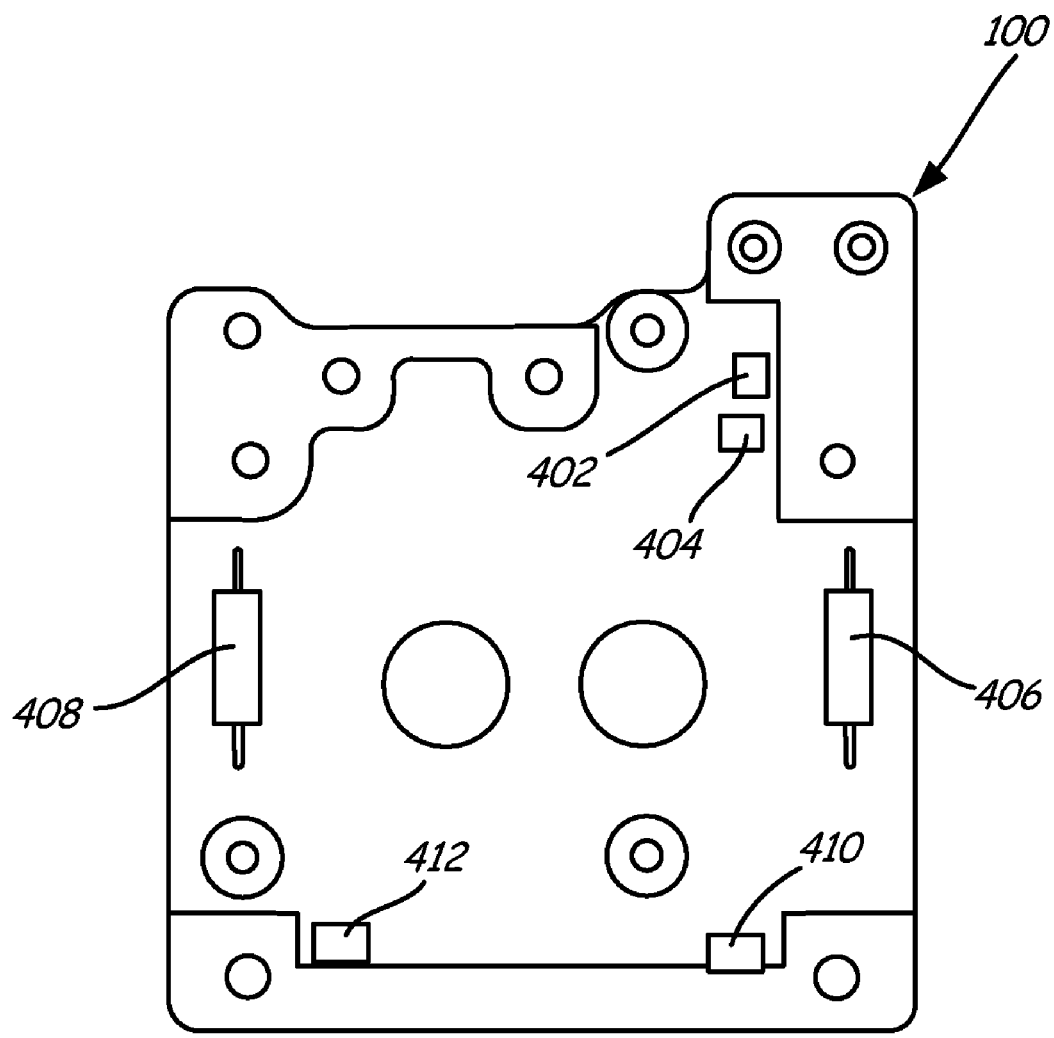
FIG. 6 shows a top view of a printed wiring board having both a feed-through capacitor and other circuit components.

FIG. 5 is a perspective view, and FIG. 6 is a top view, illustrating a printed wiring board having both feed-through capacitor 100 and other circuit components, as described above. Specifically, in the example shown, the printed wiring board includes optical coupler 402, resistors 404, 406 and 408, and capacitors 410 and 412 operatively connected to feed-through capacitor 100 and configured to provide voltage sense circuitry. Other circuit component arrangements could be provided on the printed wiring board in other embodiments, as can be appreciated by one of ordinary skill in the art.

The invention is a feed-through capacitor that is constructed in a printed wiring board. The capacitor uses alternating layers of metal and a plastic dielectric material. The large number of layers and the flexible geometry of this device allow it to be used in many applications, particularly in those involving high power high current.

Although the present invention has been described with reference to preferred embodiments, workers skilled in the art will recognize that changes may be made in form and detail without departing from the spirit and scope of the invention.

The invention claimed is:

1. A feed-through capacitor for connecting a conductive stud to a chassis wall in a device, the feed-through capacitor comprising:
 a printed wiring board;
 a plurality of first metal layers in the printed wiring board electrically connected to the chassis wall; and
 a plurality of second metal layers formed in the printed wiring board and alternating with the first metal layers, and spaced from the first metal layers by dielectric material of the printed wiring board, the second metal layers being electrically connected to the conductive stud.

2. The feed-through capacitor of claim 1 wherein the first and second metal layers comprise copper.

3. The feed-through capacitor of claim 1 wherein the dielectric material of the printed wiring board substrate comprises a polymer.

4. The feed-through capacitor of claim 1 further comprising:
 an opening configured to receive the conductive stud extending through the printed wiring board and the first and second metal layers.

5. The feed-through capacitor of claim 4, wherein the opening has an inside diameter coated with metal electrically connected to the conductive stud and to the second metal layer.

6. The feed-through capacitor of claim 1 further comprising:
 a metal ring electrically connected to the chassis around a peripheral portion of the feed-through capacitor, the metal ring being electrically connected to the first metal layers.

7. The feed-through capacitor of claim 1 further comprising:
 at least one circuit component arranged on the printed wiring board, operatively connected with the feed-through capacitor.

* * * * *